United States Patent
Takano et al.

(10) Patent No.: US 11,456,574 B2
(45) Date of Patent: Sep. 27, 2022

(54) EXTERNAL-CAVITY SEMICONDUCTOR LASER

(71) Applicant: NICHIA CORPORATION, Anan (JP)

(72) Inventors: Tetsushi Takano, Yokohama (JP); Hisashi Ogawa, Yokohama (JP); Hidetoshi Katori, Itabashi-ku (JP); Masao Takamoto, Setagaya-ku (JP)

(73) Assignee: NICHIA CORPORATION, Anan (JP)

( * ) Notice: Subject to any disclaimer, the term of this patent is extended or adjusted under 35 U.S.C. 154(b) by 272 days.

(21) Appl. No.: 16/849,307

(22) Filed: Apr. 15, 2020

(65) Prior Publication Data
US 2020/0335941 A1  Oct. 22, 2020

(30) Foreign Application Priority Data

Apr. 16, 2019  (JP) .............................. JP2019-077969

(51) Int. Cl.
*H01S 5/14* (2006.01)
*H01S 5/028* (2006.01)
(Continued)

(52) U.S. Cl.
CPC ............ *H01S 5/141* (2013.01); *H01S 3/0623* (2013.01); *H01S 3/08059* (2013.01); *H01S 5/028* (2013.01); *H01S 5/32341* (2013.01)

(58) Field of Classification Search
CPC .... H01S 5/141; H01S 3/0623; H01S 3/08059; H01S 5/028; H01S 5/32341
See application file for complete search history.

(56) References Cited

U.S. PATENT DOCUMENTS

2012/0099185 A1* 4/2012 Yokoyama ............ H01S 5/0657
                                                                372/18
2014/0003818 A1* 1/2014 Lee ......................... H01S 5/141
                                                                398/88

FOREIGN PATENT DOCUMENTS

JP   2002-116005 A   4/2002
JP   2009-258406 A  11/2009
WO   WO-2008119363 A1 * 10/2008 ............. H01S 5/141

OTHER PUBLICATIONS

Thompson et al., "Narrow linewidth tunable external cavity diode laser using wide bandwidth filter", Review of Scientific Instruments, 2012, vol. 83, Issue 2. (Year: 2012).*

(Continued)

*Primary Examiner* — Yuanda Zhang
(74) *Attorney, Agent, or Firm* — Foley & Lardner LLP

(57) ABSTRACT

An external-cavity semiconductor laser includes a semiconductor laser element containing a gallium nitride material, a first lens disposed in an optical path of light emitted from the semiconductor laser element, a wavelength selective element disposed in an optical path of light transmitted through the first lens and configured to selectively transmit light having a predetermined wavelength, a second lens disposed in an optical path of light transmitted through the wavelength selective element, an output coupler disposed in an optical path of light condensed through the second lens, and a light-transmissive protective member bonded to at least one surface of the output coupler. The second lens is configured to cause light transmitted through the second lens and incident on the output coupler to form an image on a surface of the output coupler. The protective member covers the surface of the output coupler on which the image is formed.

19 Claims, 5 Drawing Sheets

(51) Int. Cl.
  *H01S 5/323* (2006.01)
  *H01S 3/06* (2006.01)
  *H01S 3/08* (2006.01)

(56) References Cited

OTHER PUBLICATIONS

Thompson et al., "Narrow linewidth tunable external cavity diode laser using wide bandwidth filter", Review of Scientific Instruments, 2012, vol. 83, Issue 2.

* cited by examiner

EXTERNAL-CAVITY SEMICONDUCTOR LASER

CROSS-REFERENCE TO RELATED APPLICATION

This application is based upon and claims priority to Japanese Patent Application No. 2019-077969, filed on Apr. 16, 2019, the entire contents of which are incorporated herein by reference.

BACKGROUND

The present disclosure relates to an external-cavity semiconductor laser.

An external-cavity semiconductor laser (external-cavity laser diode: hereinafter also referred to as an "ECLD") with a cat's eye configuration in which light is condensed on a reflection surface of a mirror is considered to have a sturdier cavity structure and a higher frequency stability than a conventional ECLD with a diffraction grating (see, for example, Daniel J. Thompson, Robert E. Scholten, "Narrow linewidth tunable external cavity diode laser using wide bandwidth filter" Review of Scientific Instruments 83, 023107 (February 2012)).

SUMMARY

However, if a gallium nitride semiconductor laser (GaN LD) is used for such an ECLD with a cat's eye configuration, power tends to be reduced.

One object of the present invention is to provide an external-cavity semiconductor laser including a gallium nitride semiconductor laser as a light source.

An external-cavity semiconductor laser according to one embodiment of the present invention includes a semiconductor laser element containing a gallium nitride material; a first lens disposed in an optical path of light emitted from the semiconductor laser element; a wavelength selective element disposed in an optical path of light transmitted through the first lens and configured to selectively transmit light having a predetermined wavelength; a second lens disposed in an optical path of light transmitted through the wavelength selective element; an output coupler disposed in an optical path of light condensed through the second lens; and a light-transmissive protective member bonded to at least one surface of the output coupler. A cavity is located between the semiconductor laser element and the output coupler. The second lens is configured to cause light transmitted through the second lens and incident on the output coupler to form the image on a surface of the output coupler. The protective member covers the surface of the output coupler on which the image is formed.

An external-cavity semiconductor laser according to another embodiment of the present invention includes a semiconductor laser element containing a gallium nitride material; a first lens disposed in an optical path of light emitted from the semiconductor laser element; a wavelength selective element disposed in an optical path of light transmitted through the first lens and configured to selectively transmit light having a predetermined wavelength; a second lens disposed in an optical path of light transmitted through the wavelength selective element; and an output coupler disposed in an optical path of light condensed through the second lens. A cavity is located between the semiconductor laser element and the output coupler. The second lens is configured to cause light to form an image on the output coupler. An entirety or a portion of the cavity is dust-free sealed, the portion of the cavity including at least the output coupler.

In an external-cavity semiconductor laser according to one embodiment of the present invention, in addition to the structure described above, the protective member can be directly bonded to the output coupler.

In an external-cavity semiconductor laser according to another embodiment of the present invention, in addition to the above structure, the second lens can be an aspheric lens configured to reduce spherical aberration due to refraction when light enters the protective member. This structure allows light to form an image on the output coupler with reduced aberration.

In an external-cavity semiconductor laser according to still another embodiment of the present invention, in addition to any of the structures described above, the surface of the output coupler bonded to the protective member can be coated with a multilayer film. With the bonded surface coated with a light-resistant film in the above structure, light can be reflected at a required reflectance.

In an external-cavity semiconductor laser according to still another embodiment of the present invention, in addition to any of the structures described above, the protective member can have a reflectance lower than a reflectance determined from the refractive index of the material constituting the protective member.

In an external-cavity semiconductor laser according to still another embodiment of the present invention, in addition to any of the structures described above, the protective member can have a thickness in a range of 0.3 mm to 3.5 mm.

An external-cavity semiconductor laser according to still another embodiment of the present invention may include, in addition to any of the structures described above, an actuator can be disposed in the cavity.

In an external-cavity semiconductor laser according to still another embodiment of the present invention, in addition to any of the above structures, the semiconductor laser can have a peak emission wavelength in a range of 360 nm to 520 nm.

In an external-cavity semiconductor laser according to still another embodiment of the present invention, in addition to any of the above structures, the wavelength selective element can be an interference filter.

In an external-cavity semiconductor laser according to still another embodiment of the present invention, in addition to any of the above structures, the semiconductor laser element can include a nitride semiconductor represented as $In_XAl_YGa_{1-X-Y}N$ (where $0 \leq X$, $0 \leq Y$, and $X+Y<1$).

In an external-cavity semiconductor laser according to still another embodiment of the present invention, in addition to any of the above structures, anti-reflection (AR) coatings can be applied to an end surface of the semiconductor laser element.

In the structures described above, disposing a protective member on the reflection surface or dust-free sealing on the reflection surface allows for effectively reducing optical dust attraction, which may occur when a cat's eye lens condenses light on the reflection surface of the output coupler.

DETAILED DESCRIPTION

Figure 1:
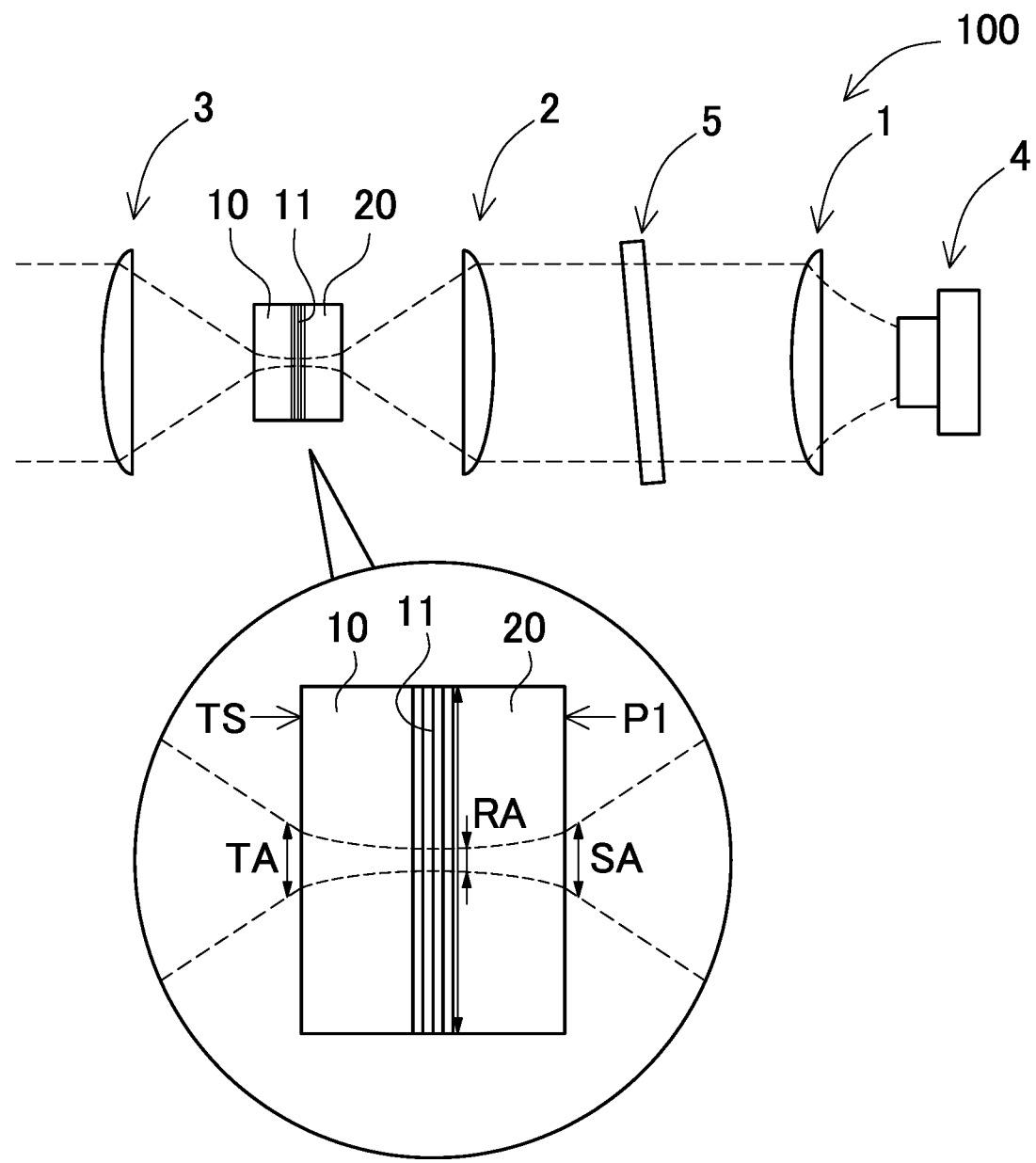
FIG. 1 schematically shows an external-cavity semiconductor laser according to a first embodiment.

Certain embodiments and their modified examples of the present invention will be described below on the basis of the accompanying drawings. The embodiments and modified examples described below are examples intended to give a concrete form to the technical concept of the present invention and are not intended to limit the scope of the present invention to the description in the embodiments or modified examples described below. Sizes or positional relationships of members illustrated in each drawing may be exaggerated in order to clarify the descriptions. Furthermore, in the descriptions below, the same name or the same reference numeral represents the same member or a member made of the same material, and its duplicative description will be omitted as appropriate. As for each element in embodiments or modified examples of the present invention, a plurality of elements may be formed of a single member so that the member serves as the plurality of elements, or conversely, a combination of a plurality of members may serve the function of one member. Configurations described in one embodiment or one modified example may be applicable to another embodiment or another modified example. In the present specification, use of the term "on" in a context such as "on a layer" is not necessarily limited to the case in which something is formed in contact with the upper surface, but rather also includes the case in which something is formed above and away from the upper surface, such as the case in which an interposing layer is disposed between two layers.

First Embodiment

FIG. 1 schematically shows an external-cavity semiconductor laser 100 according to a first embodiment of the present invention. The external-cavity semiconductor laser 100 shown in FIG. 1 includes a semiconductor laser element 4, a first lens 1, a wavelength selective element 5, a second lens 2, an output coupler 10, and a third lens 3. In the external-cavity semiconductor laser 100, a cavity is located between the semiconductor laser element and the output coupler.

Semiconductor Laser Element 4

The semiconductor laser element 4 is a semiconductor light-emitting element containing a gallium-nitride-based material. The semiconductor laser element 4 preferably has a peak emission wavelength in a range of 360 nm to 520 nm. A semiconductor laser element 4 configured to emit blue light is more preferable. Anti-reflection (AR) coatings are desirably applied to the light emitting surface of the semiconductor laser element 4. Optical dust attraction is particularly likely when a peak emission wavelength of the semiconductor laser is in the range of less than 500 nm. The inventors of the present application have found that the optical dust attraction leads to deterioration of the ECLD (this will be described below in detail).

The semiconductor laser element 4 is manufactured such that a semiconductor layered body is epitaxially grown on a substrate. A substrate made of a nitride semiconductor such as GaN or AlN is used for the growth substrate. A substrate other than nitride semiconductor substrates may be used. Examples of such a substrate include an insulating substrate such as a sapphire substrate, a nitride semiconductor substrate made of SiC, Si, ZnO, $Ga_2O_3$, and GaAs, and a template substrate in which a nitride semiconductor is grown on glass or the like. Examples of a material used for the semiconductor layered body include a nitride semiconductor represented as $In_XAl_YGa_{1-X-Y}N$ (where $0 \leq X$, $0 \leq Y$, and $X+Y<1$).

First Lens 1

The first lens 1 is an optical member configured to collimate the emitted light. The first lens 1 is disposed in the optical path of light emitted from the semiconductor laser element 4, at the light emitting surface side of the semiconductor laser element 4. A lens such as an aspheric lens or a plano-convex lens may be used for the first lens 1. AR-coatings may be applied to the first lens 1.

Wavelength Selective Element 5

The wavelength selective element 5 is configured to selectively transmit light having a predetermined wavelength. By selecting a specific wavelength of light emitted from the semiconductor laser element 4, which is the light source, the ECLD can produce output light having a desired wavelength. The wavelength selective element 5 is disposed in the optical path of light collimated through the first lens 1. For the wavelength selective element 5, an interference filter is preferably used. Examples of a material of the wavelength selective element 5 include a transparent material such as glass, sapphire, or a fluoride material.

Second Lens 2

The second lens 2 is an optical member that is disposed in the optical path of light that has passed through the wavelength selective element 5 and configured to condense the parallel beam to cause the beam to form an image on the output coupler 10. Such a second lens 2 is also referred to as a "cat's eye lens". A lens such as an aspheric lens or a plano-convex lens can be used for the second lens 2. In particular, it is desirable to use an aspheric lens configured in consideration of the refractive index of the protective member, so that light forms an image on a surface of the output coupler 10 with reduced aberration. AR-coatings may also be applied to the second lens 2.

Output Coupler 10

Figure 2:
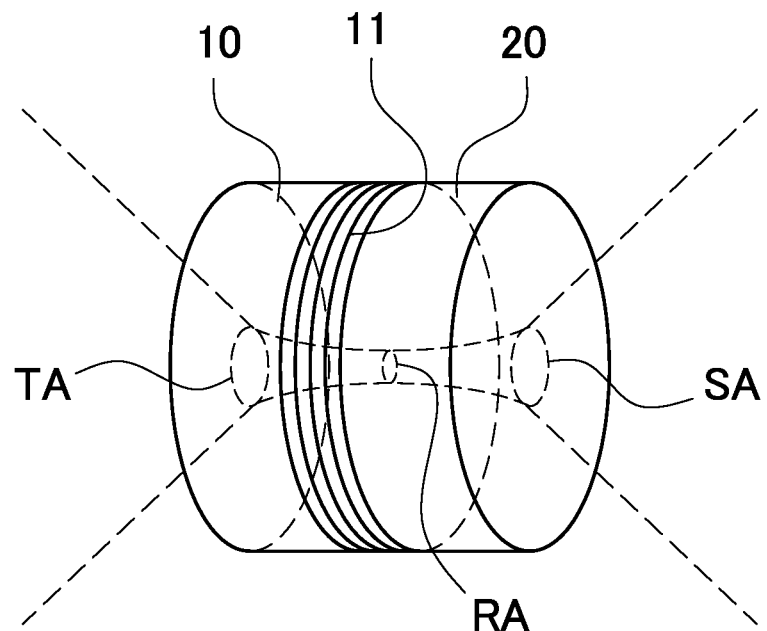
FIG. 2 is a schematic perspective view of an output coupler in FIG. 1.
Figure 3:
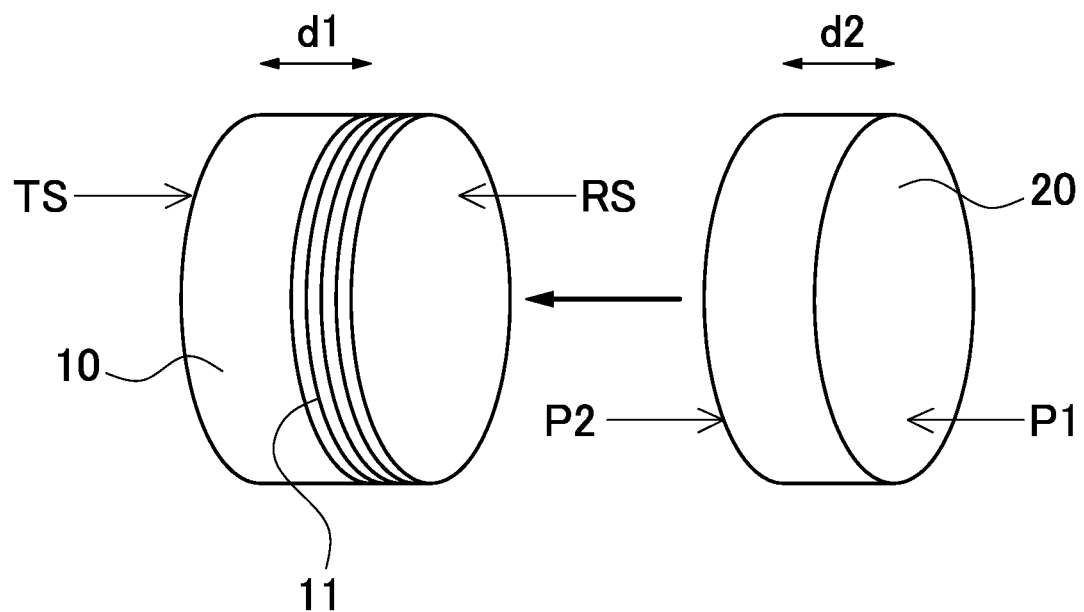
FIG. 3 is a schematic exploded perspective view of the output coupler in FIG. 2.

The output coupler 10 is disposed in the optical path of light that has been condensed through the second lens 2. The output coupler 10 may preferably have a reflectance in a range of 20% to 30%. When the interference filter has transmittance for light that has passed through the interference filter twice (i.e., reciprocating) of X %, about (100−X) % is desirably added to the reflectance of the output coupler 10. The output coupler 10 may be made of a transparent material such as glass, sapphire, or a fluoride material. FIG. 2 is a schematic perspective view of the output coupler 10. FIG. 3 is a schematic exploded perspective view of the output coupler 10. As shown in FIG. 3, the output coupler 10 has a transmission surface TS and a reflection surface RS. The reflection surface RS and the transmission surface TS are located such that the reflection surface includes a laser spot region RA and the transmission surface includes a laser spot region TA. The reflection surface RS and the transmission surface TS should have sufficiently large areas. The expression "sufficiently large areas" as used herein indicates that, for example, the areas of the surfaces RS and TS are at least 10 times larger than the areas of the regions RA and TA, respectively, as shown in FIG. 1.

Multilayer Film 11

The reflection surface RS of the output coupler 10 is preferably coated with a multilayer film 11. When the reflection surface RS is coated with the light-resistant multilayer film 11, reflection at a required reflectance may be obtained. Examples of a material of the multilayer film 11 used for the coating include $Ta_2O_5$, $SiO_2$, or the like. The multilayer film 11 has a thickness designed in consideration of the refractive index of the material of the multilayer film 11.

Protective Member 20

Further, a light-transmissive protective member 20 is bonded to at least the reflection surface RS of the output coupler 10 as shown in FIG. 3. This structure allows light transmitted through the second lens 2 to be incident on the output coupler 10 through the protective member 20. The protective member 20 preferably has a high transmittance. For example, the incident surface of the protective member 20 is desirably AR-coated. This structure allows for reducing optical dust attraction without hindering laser light condensed at the output coupler 10 side with the second lens 2 and thus without reducing the extraction efficiency of laser light. In other words, the protective member is preferably provided with a configuration (e.g., AR coating) that allows the protective member to have a reflectance lower than the reflectance determined according to the refractive index of a material constituting the protective member. For example, in the case in which the protective member that is not AR-coated has the reflectance of 4%, the protective member provided with AR-coating can have a reflectance reduced to 0.3% or less.

The protective member 20 may be made of a material such as BK7, synthetic fused silica, $MgF_2$, or the like. The protective member 20 is preferably bonded directly to the output coupler 10 without a bonding member such as an adhesive material. This structure allows for improving adhesion between the protective member 20 and the output coupler 10, and reducing optical losses and deterioration of the pattern caused by the adhesive material or the like.

The protective member 20 and the output coupler 10 are both mainly made of an inorganic material and may be directly bonded together by, for example, compression, sintering, surface-activated bonding, atomic diffusion bonding, or hydroxy-group bonding.

The shape and size of the protective member 20 are designed according to the shape of the output coupler 10 and the size of the laser spot region. A surface-side region P1 of the protective member includes a laser spot region SA on a surface of the protective member. A reflection-surface-side region P2 of the protective member includes the laser spot region RA on the reflection surface. The surface-side region P1 and the reflection-surface-side region P2 should have sufficiently large areas. The expression "sufficiently large areas" as used herein indicates that, for example, the areas of the surface-side region P1 and the reflection-surface-side region P2 are at least 10 times larger than the areas of the laser spot region SA and the laser spot region RA, respectively, as shown in FIG. 1. The protective member 20 may have a disc shape having an area substantially equal to or greater than the area of the reflection surface RS of the output coupler 10. This structure allows the entirety of the reflection surface RS including the laser spot region RA to be protected by the protective member 20, and light to be transmitted on the incident surface without reducing the light output.

The protective member 20 preferably has a thickness d2 in a range of 0.3 mm to 3.5 mm, while depending on the spot diameter of the beam the beam intensity on the reflection surface RS. With the protective member 20 having a certain thickness as described above, the spot diameter of condensed laser light on the surface of the protective member 20 is increased as shown in FIG. 2, so that optical dust attraction on the surface of the protective member 20 can be reduced.

Third Lens 3

The third lens 3 is an optical member configured to convert a beam output from the output coupler 10 into a parallel beam. A lens such as an aspheric lens or a plano-convex lens may be suitably used also for the third lens 3. An aspheric lens configured in consideration of the refractive index of the transmission surface of the output coupler 10 is particularly desirable. Each of the optical members such as the first lens 1, the second lens 2, and the third lens 3 described above may be constituted of a single lens or a combination of a plurality of lenses. AR-coatings may also be applied to the third lens 3.

In the structure described above, the protective member is disposed on the reflection surface RS, which allows for effectively reducing optical dust attraction that tends to occur when a cat's eye lens condenses light on the reflection surface RS of the output coupler in a conventional technique. That is, the reflection surface RS, at which the energy density is increased, is protected to reduce dust attraction, and light from the cat's eye lens can be incident on the incident surface in a region having a large area before the light is sufficiently focused, so that occurrence of optical dust attraction can be reduced.

Figure 9:
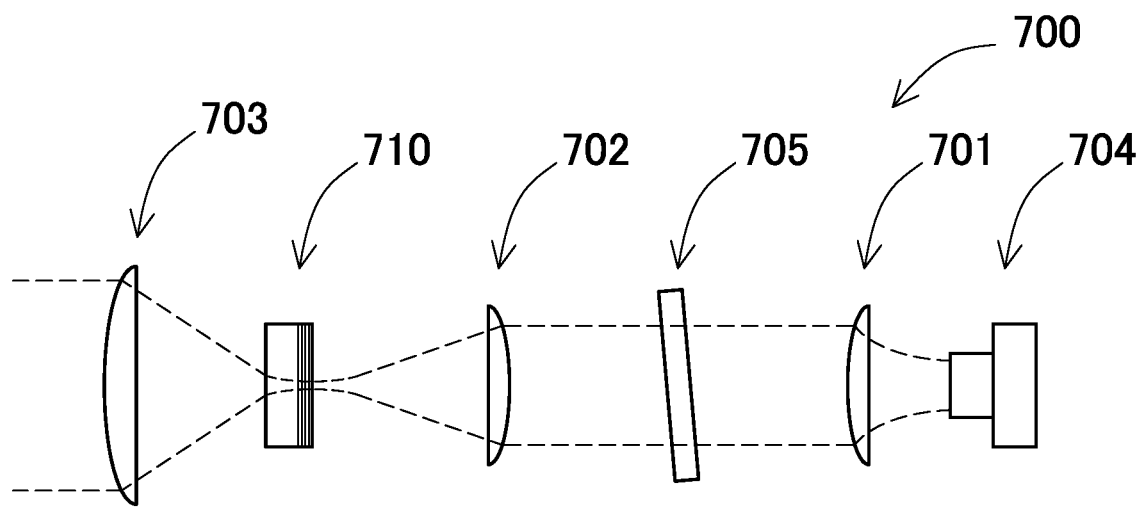
FIG. 9 schematically shows a conventional ECLD employing an interference filter.

FIG. 9 schematically shows a conventional ECLD 700 employing an interference filter. The ECLD 700 shown in this drawing includes a semiconductor laser element 704, a first lens 701, a wavelength selective element 705, a second lens 702, an output coupler 710, and a third lens 703. Such an ECLD with an interference filter is considered to have a sturdier cavity structure and higher frequency stability than a conventional LD with a diffraction grating. This sturdiness is attributed to the fact that the external cavity has a cat's eye configuration, in which light is condensed on the reflection surface of the output coupler. On the other hand, output of an ECLD with an interference filter employing a GaN LD tends to be gradually reduced, the cause of which is not apparent.

The inventors of the present application have intensively studied to find that the cause of this is optical dust attraction, and accordingly have developed the present invention. That is, while the cause of great deterioration in the output of an ECLD using a GaN LD for the light source had not been apparent, the inventors have found that the cause is that the optical tweezer effect, which causes attachment of foreign matter, increasingly occurs when laser light is condensed in a small region of the surface of the output coupler at a side where the laser light is outputted. In particular, a GaN LD has the wavelength that is short and close to the ultraviolet range to easily attract foreign matter, so that optical tweezer effect is stronger than in the case in which light with a long wavelength is used for the light source. The increase in the optical tweezer effect causes increase in optical dust attraction, so that deterioration over time of an ECLD with an interference filter employing a GaN LD has been greater than in the case of other ECLDs with interference filters.

On the other hand, in the present embodiment, the protective member 20 is disposed on the reflection surface RS of the output coupler 10 on which optical dust attraction tends to occur. Covering the reflection surface RS of the output coupler 10 on which optical dust attraction tends to occur, as described above, allows for preventing entry of foreign matter, so that optical dust attraction can be effectively reduced. On the other hand, optical dust attraction may occur on a surface of the protective member 20 that serves as a surface of the output coupler 10, the protective member 20 covering the reflection surface RS of the output coupler 10. Increasing a thickness of the protective member 20 to a certain thickness allows for reducing optical dust attraction on a surface of the protective member 20. That is, an ECLD of the cat's eye type with an interference filter is optically-designed such that light is condensed on the surface of the output coupler 10 by the second lens 2. In other words, with optical design such that light comes into a focus on the surface of the output coupler 10, the greater the distance from the surface of the output coupler 10, the greater the spot diameter of light. Studies by the inventors of the present application have revealed that the smaller the spot diameter, the greater the optical dust attraction effect, and conversely, that the larger the spot diameter, the smaller the optical dust attraction effect. Accordingly, increasing a distance between a surface of the protective member 20 that serves as a surface of the output coupler 10 and the focal point, in other words, increasing the distance between a surface of the protective member 20 that serves as a surface of the output coupler 10 and the reflection surface RS of the output coupler 10, allows for reducing the optical dust attraction effect. Thus, a cat's eye type ECLD provided with an interference filter and employing an inexpensive gallium nitride semiconductor laser for the light source can be obtained, in which optical dust attraction effect is effectively reduced. In particular, light is sufficiently spread on a surface on which light traveling in the air is incident or from which light is emitted into the air, so that optical dust attraction can be reduced. Accordingly, an external-cavity semiconductor laser with high frequency stability can be obtained. Further, oscillation with a stable wavelength can be maintained for a long time.

Second Embodiment

Figure 4:
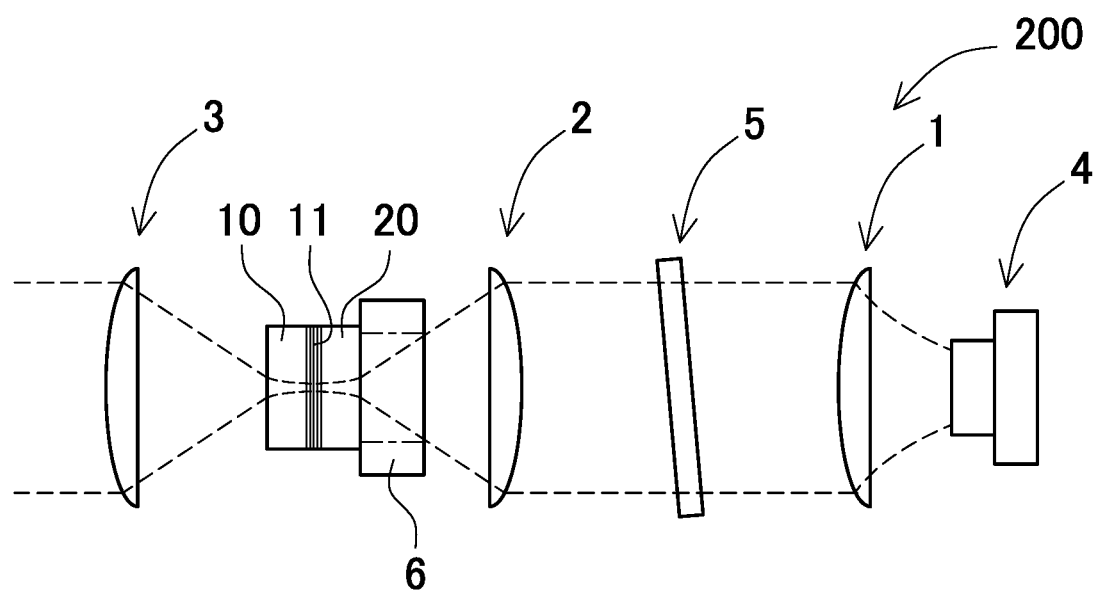
FIG. 4 schematically shows an external-cavity semiconductor laser according to a second embodiment.

FIG. 4 schematically shows an external-cavity semiconductor laser 200 according to a second embodiment of the present invention. Members having substantially the same functions as members described above are denoted by the same reference numerals, and their detailed descriptions are omitted. The external-cavity semiconductor laser 200 shown in FIG. 4 includes an actuator (in the example shown in FIG. 4, a piezoelectric element 6) located in the external cavity. This structure allows fine adjustment of length of the cavity using the piezoelectric element 6, so that the wavelength of laser light to be output can be changed, which can facilitate narrowing of the linewidth and stabilizing of the wavelength. The piezoelectric element 6 is made of a material such as lead-zirconate titanate.

Figure 5:
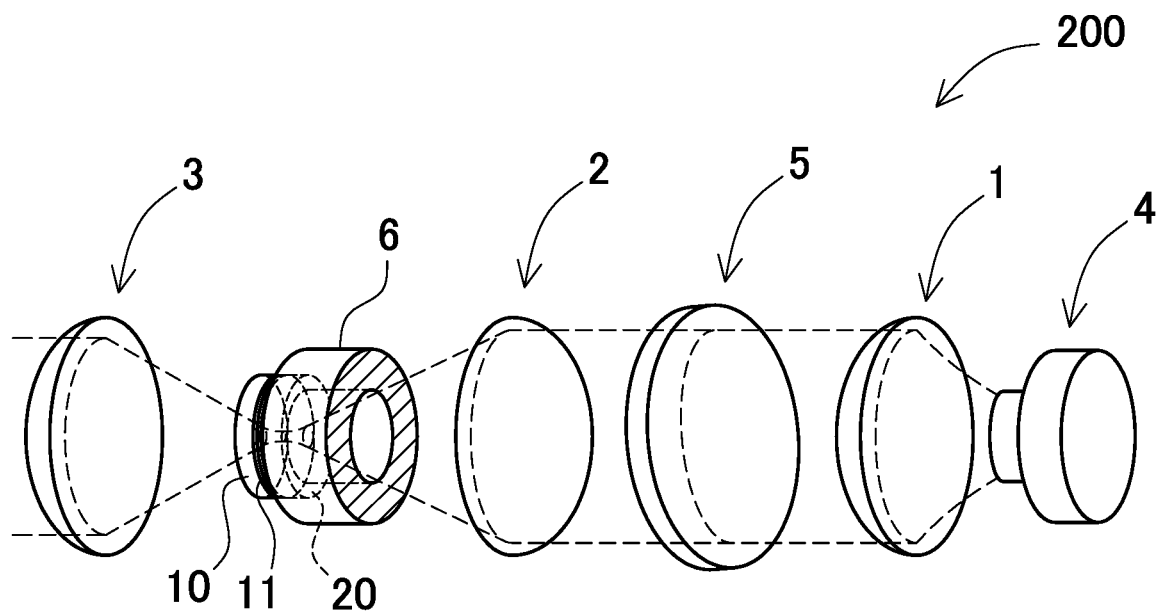
FIG. 5 is a schematic exploded perspective view illustrating a piezoelectric element in FIG. 4.

FIG. 5 is a schematic exploded perspective view illustrating the piezoelectric element 6 in FIG. 4. As shown in this drawing, the piezoelectric element 6 has an annular shape so as not to obstruct light condensation on the reflection surface RS of the output coupler 10 through the second lens 2 and the protective member 20.

Third Embodiment

Figure 6:
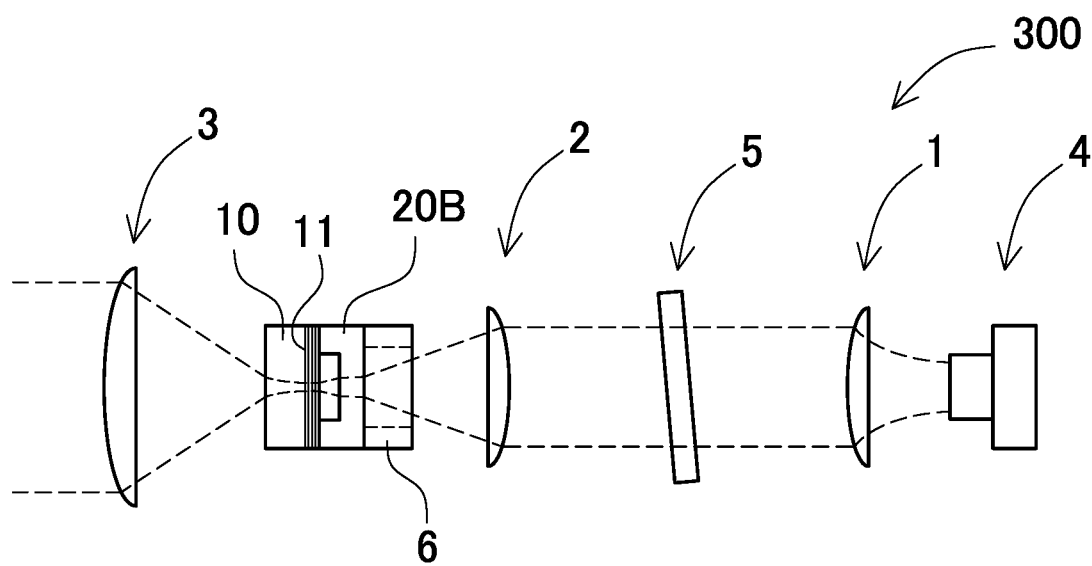
FIG. 6 schematically shows an external-cavity semiconductor laser according to a third embodiment.

In the embodiments described above, the protective member 20 directly covers the reflection surface RS of the output coupler 10. However, the present invention is not limited to the structure in which the protective member 20 covers the reflection surface RS of the output coupler 10. Rather, the entry of foreign matter may be prevented by sealing the reflection surface of the output coupler without being in contact with a portion of the reflection surface of the output coupler. FIG. 6 schematically shows such an example of an external-cavity semiconductor laser 300 according to a third embodiment. Also regarding this drawing, members having substantially the same functions as members described above are denoted by the same reference numerals, and their detailed descriptions are omitted. In the external-cavity semiconductor laser 300 shown in FIG. 6, the region in which light is condensed on the incident surface of the output coupler 10 is sealed in a dust-free manner with a light-transmissive protective member 20B. In this case, the incident surface on which light is incident is desirably apart from the reflection surface by a distance in a range of about 0.5 mm to 3.5 mm. For the protective member 20B, a material such as glass, sapphire, or a fluoride material can be used. In this structure, the reflection surface is separated from the bonded portion, which allows for using a sealing method that may cause optical losses, such as a method using an adhesive.

Figure 7:
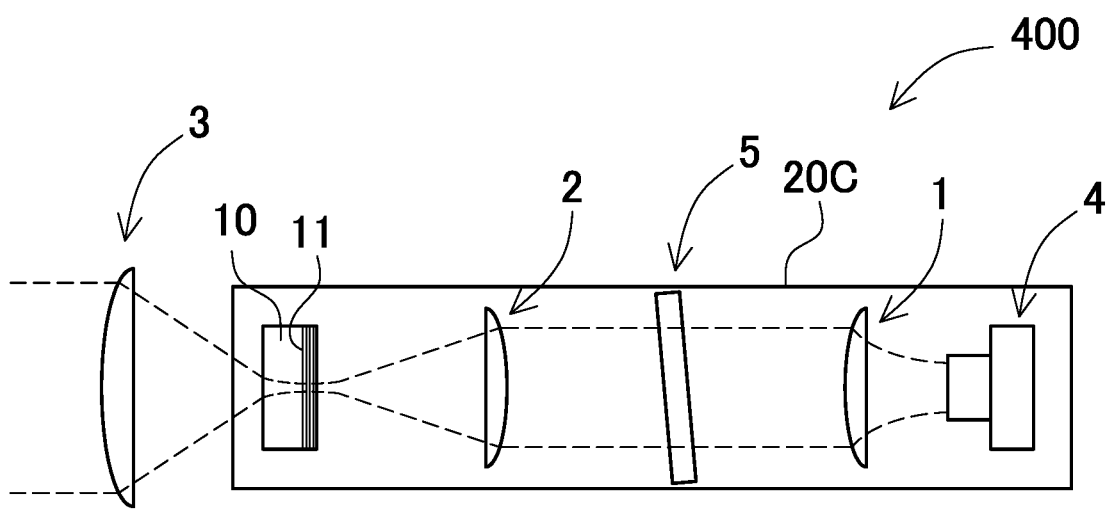
FIG. 7 schematically shows an external-cavity semiconductor laser according to a fourth embodiment.

To prevent the entry of foreign matter, which may cause optical dust attraction, for example, the cavity may be covered with a sealing member 20C to be sealed in a dust-free manner as in an external-cavity semiconductor laser 400 according to a fourth embodiment shown in FIG. 7, to allow a space in which the cavity is disposed to be maintained under vacuum or reduced pressure. Alternatively, a clean gas may be introduced in the space in which the cavity is disposed.

Figure 8:
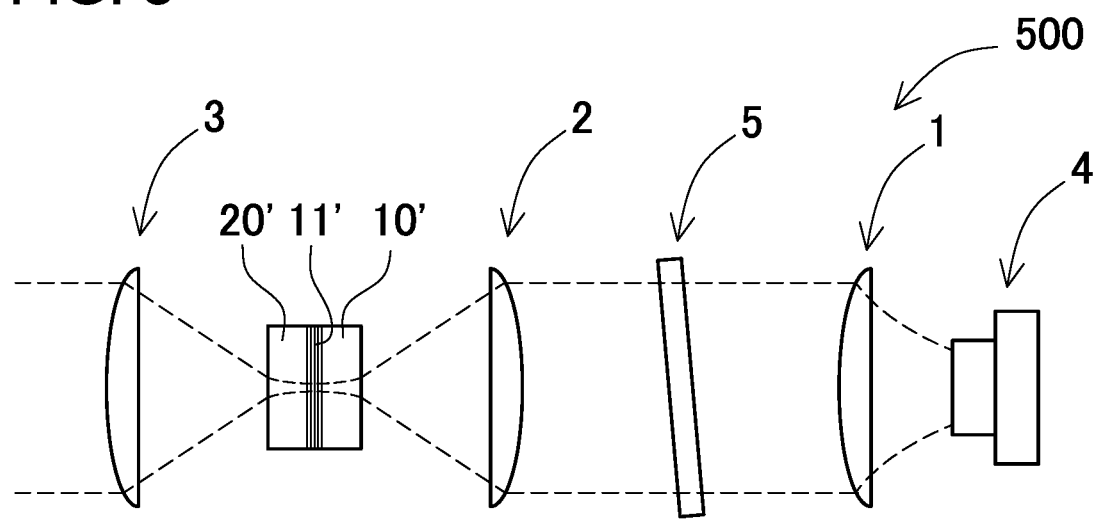
FIG. 8 schematically shows an external-cavity semiconductor laser according to a fifth embodiment.

In the description above, examples are described in which light is incident at the protective member 20 side and light is emitted from the transmission surface TS of the output coupler. An external-cavity semiconductor laser having other appropriate configurations is also within the scope of the present invention. For example, the external-cavity semiconductor laser may have a configuration in which light is incident at the transmission surface TS side of the output coupler 10 and light is emitted from the protective member 20. FIG. 8 schematically shows such an example as an external-cavity semiconductor laser according to a fifth embodiment. Also regarding this drawing, members having the same functions as members described above are denoted by the same reference numerals, and their detailed descriptions are omitted as appropriate. In an external-cavity semiconductor laser 500 shown in FIG. 8, light is incident at the transmission surface side of an output coupler 10', is condensed at the reflection surface provided with a multilayer film 11', and is emitted from a protective member 20'. This configuration also allows for reducing optical dust attraction.

According to the certain embodiments described above, disposing the protective member 20 on the reflection surface RS or dust-free sealing the reflection surface RS allows for effectively reducing optical dust attraction, which is caused when the second lens 2 condenses light on the reflection surface RS of the output coupler 10. In other words, the reflection surface RS, at which the energy density is high, is protected to reduce dust attraction, and light traveling from the second lens 2 can be incident on a surface of the protective member 20 in a region having a large area before light is sufficiently focused, so that occurrence of the optical dust attraction can be reduced.

The external-cavity semiconductor lasers according to the embodiments may be suitably used for laser cooling, precision spectroscopy, high-order harmonic generation, LiDAR, and the like.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. An external-cavity semiconductor laser comprising:
   a semiconductor laser element containing a gallium nitride material;
   a first lens disposed in an optical path of light emitted from the semiconductor laser element;
   a wavelength selective element disposed in an optical path of light transmitted through the first lens and configured to selectively transmit light having a predetermined wavelength;
   a second lens disposed in an optical path of light transmitted through the wavelength selective element;
   an output coupler disposed in an optical path of light condensed through the second lens, the output coupler having a reflection surface, and a transmission surface opposite the reflection surface; and
   a light-transmissive protective member bonded to and facing the reflection surface of the output coupler,
   wherein a cavity is located between the semiconductor laser element and the output coupler,
   wherein the second lens is configured to cause light transmitted through the second lens and incident on the output coupler to form an image on a portion of the reflection surface of the output coupler, and
   wherein the protective member covers the portion of the reflection surface of the output coupler on which the image is formed.

2. The external-cavity semiconductor laser according to claim 1, wherein the protective member is directly bonded to the output coupler.

3. The external-cavity semiconductor laser according to claim 1, wherein the second lens comprises an aspheric lens configured to reduce spherical aberration due to refraction when light is incident on the protective member.

4. The external-cavity semiconductor laser according to claim 1, wherein the at least one surface of the output coupler bonded to the protective member is coated with a multilayer film.

5. The external-cavity semiconductor laser according to claim 1, wherein the protective member is provided with a configuration that allows the protective member to have a reflectance lower than a reflectance determined from a refractive index of a material constituting the protective member.

6. The external-cavity semiconductor laser according to claim 1, wherein the protective member has a thickness in a range of 0.3 mm to 3.5 mm.

7. The external-cavity semiconductor laser according to claim 1, further comprising an actuator disposed in the cavity.

8. The external-cavity semiconductor laser according to claim 1, wherein the semiconductor laser has a peak emission wavelength in a range of 360 nm to 520 nm.

9. The external-cavity semiconductor laser according to claim 1, wherein the wavelength selective element comprises an interference filter.

10. The external-cavity semiconductor laser according to claim 1, wherein the semiconductor laser element comprises a nitride semiconductor represented as $In_XAl_YGa_{1-X-Y}N$, where $0 \leq X$, $0 \leq Y$, and $X+Y<1$.

11. The external-cavity semiconductor laser according to claim claim 10, wherein an anti-reflection coating is disclosed on an end surface of the semiconductor laser element.

12. The external-cavity semiconductor laser according to claim 1, wherein the protective member has a disc shape.

13. An external-cavity semiconductor laser comprising:
    a semiconductor laser element containing a gallium nitride material;
    a first lens disposed in an optical path of light emitted from the semiconductor laser element;
    a wavelength selective element disposed in an optical path of light transmitted through the first lens and configured to selectively transmit light having a predetermined wavelength;
    a second lens disposed in an optical path of light transmitted through the wavelength selective element;
    an output coupler disposed in an optical path of light condensed through the second lens, the output coupler having a reflection surface, and a transmission surface opposite the reflection surface; and
    a light-transmissive protective member having a first surface in which a recess is located, wherein a portion of the first surface that surrounds the recess is bonded to and faces the reflection surface of the output coupler such that the recess is sealed in a dust-free manner,
    wherein a cavity is located between the semiconductor laser element and the output coupler,
    wherein the second lens is configured to cause light to form an image on the output coupler, and
    wherein at least the output coupler is disposed in the cavity.

14. The external-cavity semiconductor laser according to claim 13, further comprising an actuator disposed in the cavity.

15. The external-cavity semiconductor laser according to claim 13, wherein the semiconductor laser has a peak emission wavelength in a range of 360 nm to 520 nm.

16. The external-cavity semiconductor laser according to claim 13, wherein the wavelength selective element comprises an interference filter.

17. The external-cavity semiconductor laser according to claim 13, wherein the semiconductor laser element comprises a nitride semiconductor represented as $In_XAl_YGa_{1-X-Y}N$, where $0 \leq X$, $0 \leq Y$, and $X+Y<1$.

18. The external-cavity semiconductor laser according to claim 17, wherein an anti-reflection coating is disposed on an end surface of the semiconductor laser element.

19. The external-cavity semiconductor laser according to claim 13, wherein the protective member has a thickness in a range of 0.3 mm to 3.5 mm.

* * * * *

UNITED STATES PATENT AND TRADEMARK OFFICE
CERTIFICATE OF CORRECTION

PATENT NO. : 11,456,574 B2
APPLICATION NO. : 16/849307
DATED : September 27, 2022
INVENTOR(S) : Tetsushi Takano et al.

It is certified that error appears in the above-identified patent and that said Letters Patent is hereby corrected as shown below:

In the Claims

Claim 11, Column 10, Line 12:
Please delete:
"The external-cavity semiconductor laser according to claim claim 10,"
Please replace with:
"The external-cavity semiconductor laser according to claim 10,"

Signed and Sealed this
Fourteenth Day of March, 2023

Katherine Kelly Vidal
*Director of the United States Patent and Trademark Office*